United States Patent [19]

Lim

[11] Patent Number: 5,757,863
[45] Date of Patent: *May 26, 1998

[54] APPARATUS FOR DECODING A SIGNAL ENCODED BY USING TRELLIS CODED MODULATION

[75] Inventor: Yong-Hee Lim, Seoul, Rep. of Korea

[73] Assignee: Daewoo Electronics Co., Ltd., Seoul, Rep. of Korea

[*] Notice: The term of this patent shall not extend beyond the expiration date of Pat. No. 5,654,986.

[21] Appl. No.: 563,171

[22] Filed: Nov. 27, 1995

[30] Foreign Application Priority Data

Nov. 28, 1994 [KR] Rep. of Korea ............ 1994-31481

[51] Int. Cl.$^6$ ............ H04L 27/06; H03M 13/12
[52] U.S. Cl. ............ 375/341; 371/43
[58] Field of Search ............ 375/264, 265, 375/261, 262, 341, 331, 340; 329/304; 371/43

[56] References Cited

U.S. PATENT DOCUMENTS 5,233,629 8/1993 Paik et al. ............ 375/260

OTHER PUBLICATIONS

Bernard Sklar, "Digital Communications Fundamentals and Applications," Prentice Hall, pp. 167–182,260263 &329–342, 1988.

*Primary Examiner*—Tesfaldet Bocure
*Attorney, Agent, or Firm*—Anderson, Kill & Olick, P.C.

[57] ABSTRACT

A GA HDTV decoding system recovers a data symbol including a first bit and (N-1) remaining bits from a transmitted signal, wherein the first bit of the data symbol is coded by a ½ convolutional encoder to provide two coded bits and a modulated signal corresponding to the data symbol is selected among $2^{N+1}$ predetermined signals, amplitude of each of the predetermined signals corresponds to one of $2^{N+1}$ combinations of the remaining (N-1) bits of the data symbol and the two coded bits, and the modulated signal is transmitted by a channel to form a transmitted signal. The decoding system comprises means for deciding the (N-1) remaining bits of the data symbol in response to the transmitted signal; means for providing two bit metrics in response to the transmitted signal wherein each of the bit metric is a number reflecting a confidence level that each of the coded bits is "1"; and means for determining the first bit of the data symbol from the two bit metrics.

3 Claims, 4 Drawing Sheets

HARD DECISION

SOFT DECISION

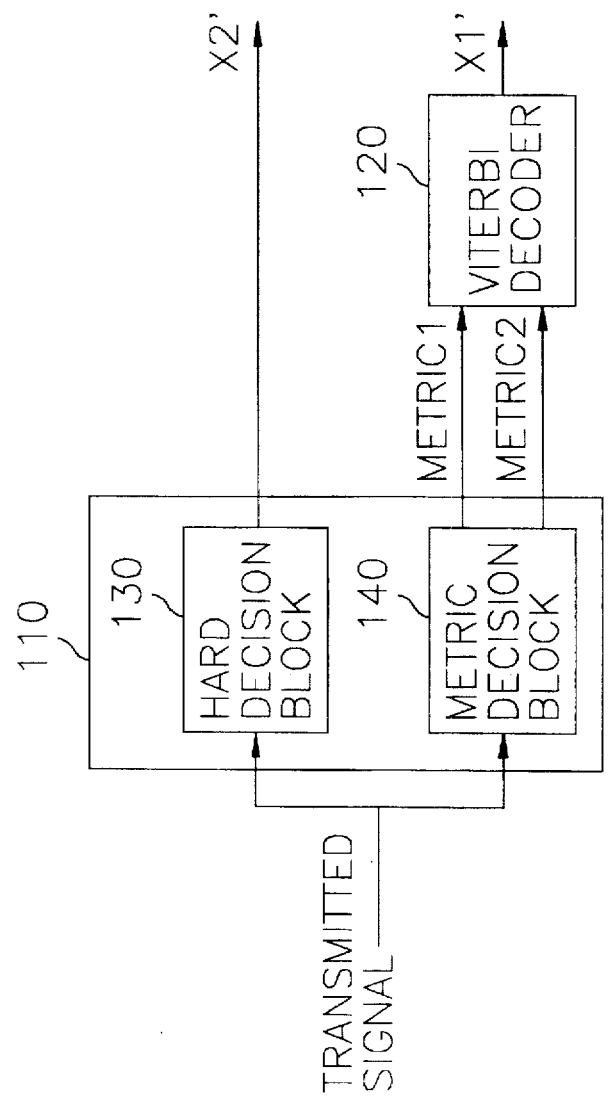

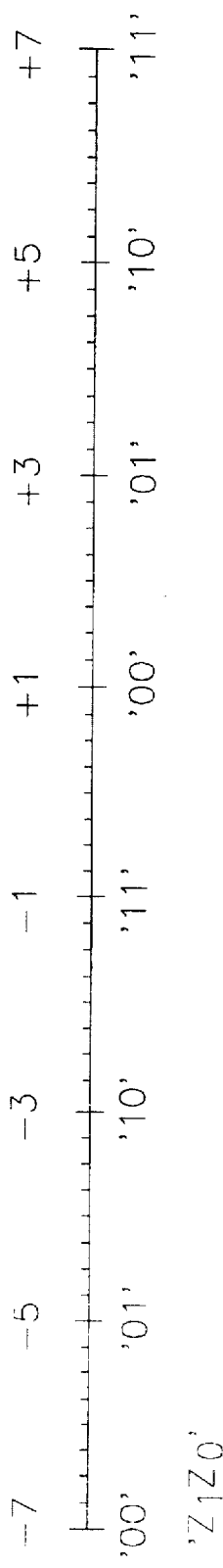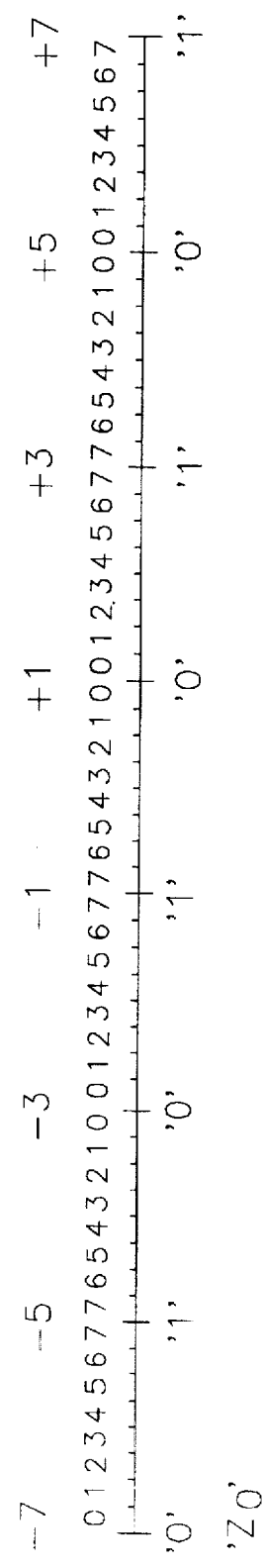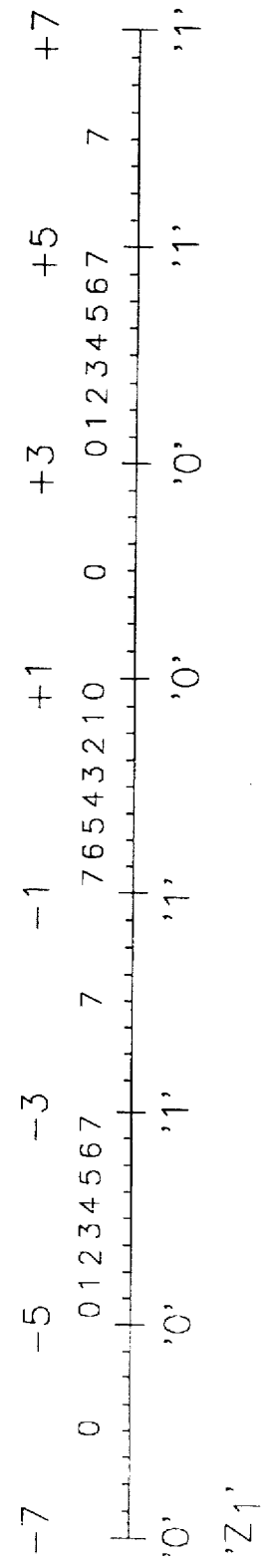

APPARATUS FOR DECODING A SIGNAL ENCODED BY USING TRELLIS CODED MODULATION

FIELD OF THE INVENTION

The present invention relates to an apparatus for decoding a trellis coded modulation signal; and, more particularly, to an apparatus for deciding a bit metric for decoding a transmitted signal which has been coded and transferred by using a trellis coded modulation in a grand alliance ("GA") high definition television ("HDTV") system.

DESCRIPTION OF THE PRIOR ART

Digital data, for example, digitized video signals for use in broadcasting high definition television signals, can be transmitted over terrestrial VHF or UHF analog channels for communication to end users. However, analog channels tend to deliver corrupted and transformed versions of their input waveforms. The corruption of waveforms, usually statistical, may be additive and/or multiplicative of impulse noises and fadings.

In order to communicate digital data via an analog channel, the data is preferably modulated by using, for example, a form of Pulse Amplitude Modulation("PAM"), wherein each signal is of a pulse whose amplitude level is determined by the digital data.

On the other hand, the so-called trellis coded modulation ("TCM") has evolved as a combined coding and modulation technique for digital transmission over band-limited channels. It achieves significant coding gains over a conventional uncoded multilevel modulation without compromising its bandwidth efficiency. The TCM scheme utilizes a redundant nonbinary modulation in combination with a finite-state encoder which governs the selection of the modulation signals to generate coded signal sequences. In a receiver, transmitted signals containing the noises are decoded by a maximum likelihood sequence decoder. Such schemes can improve the robustness of digital transmission against additive noises over the conventional uncoded modulation. This improvement is obtained without a bandwidth expansion or a reduction in the effective information rate as exacted by other known error correction schemes. The term "trellis" is used because these schemes can be described by a state-transition (trellis) diagram similar to trellis diagrams of binary convolutional codes. The difference is that TCM extends the principle of convolutional coding to nonbinary modulation with signal sets of an arbitrary size.

A more extensive discussion on TCM is given in, e.g., G. Ungerboeck, "Trellis-Coded Modulation with Redundant Signal Sets—Part I: Introduction; Part II: State of the Art", IEEE *Communication Magazine*, 25, No. 2, pp 5–21 (February, 1987).

A Viterbi algorithm is predominantly used for performing maximum likelihood decoding of a trellis code. It is widely recognized that better decisions can be made on the actual value of a received symbol, if soft information is available. That is, if it is known to the decoder during error correction as to what the level of its quality is when the signal is received, a better decision can be made about the true value of the transmitted symbol. Therefore, an improved bit error rate performance can be attained for the trellis coded modulation with Viterbi decoding by using the signal amplitude as channel state information for a soft-decision decoding.

To do this, a bit metric is utilized in the soft-decision decoding, wherein the bit metric is a number reflecting the confidence level that a bit is a binary "1" or "0".

A transmission system for a HDTV standard proposed by GA employs a ⅔ rate trellis code with one uncoded bit which is pre-coded for terrestrial broadcast mode. That is, one bit (LSB: Least Significant Bit) is encoded into two output bits using a ½ rate convolutional code while the other input bit (MSB: Most Significant Bit) is precoded. The signaling waveform used with the trellis code is an 8-level (3 bit) 1-dimensional constellation.

Referring to FIG. 1, there are shown a trellis encoder 20, and an 8-level symbol mapper 30 used in a GA HDTV encoding system. A LSB X1 of an input data is trellis coded in the trellis encoder 20 to Z0 and Z1, to make a 3-bit coded word (Z0, Z1, Z2) with a MSB X2 of the input data. At the 8-level symbol mapper 30, the 3-bit coded word is modulated or mapped to an 8-point 1-dimensional signal space, wherein the positions of the 8 signal points are predetermined as specified in a table provided therein. The modulated signal is further processed and transmitted to a corresponding HDTV decoding system wherein the original input data (X1, X2) are to be recovered.

In FIG. 2, a soft-decision and a hard-decision decoding methods are compared and an exemplary bit metric decision scheme is presented. In FIG. 2, '0' or '1' above modulated signal point $P_0$ or $P_1$ represents a bit of the coded word provided at an encoder, respectively. In this simple example shown in FIG. 2, only one-bit codeword is considered so that a modulated signal point is one of two points $P_0$ or $P_1$ and an actual transmitted signal is assumed to lie between the original signal points $P_0$ and $P_1$.

In the hard-decision decoding scheme, what matters is to which of the original signal points $P_0$ and $P_1$, a transmitted signal is located nearer. Therefore, a threshold, denoted as TH in FIG. 2, for deciding a value of a corresponding coded bit as 0 or 1 from the transmitted signal point is located at the middle of an interval between $P_0$ and $P_1$. Specifically, if the transmitted signal point is located to the left of TH, the corresponding coded bit is determined as 0, and vice versa.

However, in the soft-decision decoding scheme, a bit metric which reflects a distance between the transmitted signal point and a corresponding original signal point is utilized in a maximum likelihood decoder such as a Viterbi decoder. In FIG. 2, a bit metric is set to a number ranging from 0 to 7. In the scheme illustrated in FIG. 2, the interval between $P_0$ and $P_1$ is divided into 8 subintervals of equal length and each of the numbers is assigned to each of the intervals such that a larger bit metric signifies that the corresponding coded bit is more likely to be 1. Boundaries between two neighboring subintervals are denoted as TH0 to TH6.

At a GA HDTV decoding system, a received signal is demodulated to recover the input data. As stated above, the bit metrics are used in recovering the input data at a soft-decision convolutional decoder, e.g., Viterbi decoder, in the GA HDTV decoding system. A bit metric deciding scheme can influence the performance of the Viterbi decoder, and, therefore, it is crucial to select a right one for a better reconstruction of the input data therein.

SUMMARY OF THE INVENTION

It is, therefore, a primary object of the present invention to provide a method for deciding bit metrics for use in a convolutional decoder included in a GA HDTV decoding system.

In accordance with the present invention, there is provided a decoding system for recovering a data symbol including a first bit and (N-1) remaining bits from a transmitted signal, wherein the first bit of the data symbol is coded by a ½ convolutional encoder to provide two coded bits and a modulated signal corresponding to the data symbol is selected among $2^{N+1}$ predetermined signals on a 1-dimensional axis, the amplitude of each of the predetermined signals corresponds to one of $2^{N+1}$ combinations of the remaining (N-1) bits of the data symbol and the two coded bits, and the modulated signal is transmitted through a channel to form the transmitted signal, the decoding system comprising:

means for deciding the (N-1)) remaining bits of the data symbol in response to the transmitted signal;

means for providing two bit metrics in response to the transmitted signal wherein each of the bit metrics is a number reflecting a confidence level that each of the two coded bits is "1"; and means for determining the first bit of the data symbol based on the two bit metrics.

BRIEF DESCRIPTION OF THE DRAWINGS

The above and other objects and features of the present invention will become apparent from the following description of preferred embodiments given in conjunction with the accompanying drawings, in which:

FIG. 3 provides a HDTV decoding system in accordance with the present invention; and FIG. 4A–4C depicts a bit metric decision scheme of the present invention.

DETAILED DESCRIPTION OF THE PREFERRED EMBODIMENTS

Referring now to FIG. 3, there is provided a GA HDTV decoding system in accordance with the present invention.

Figure 1:
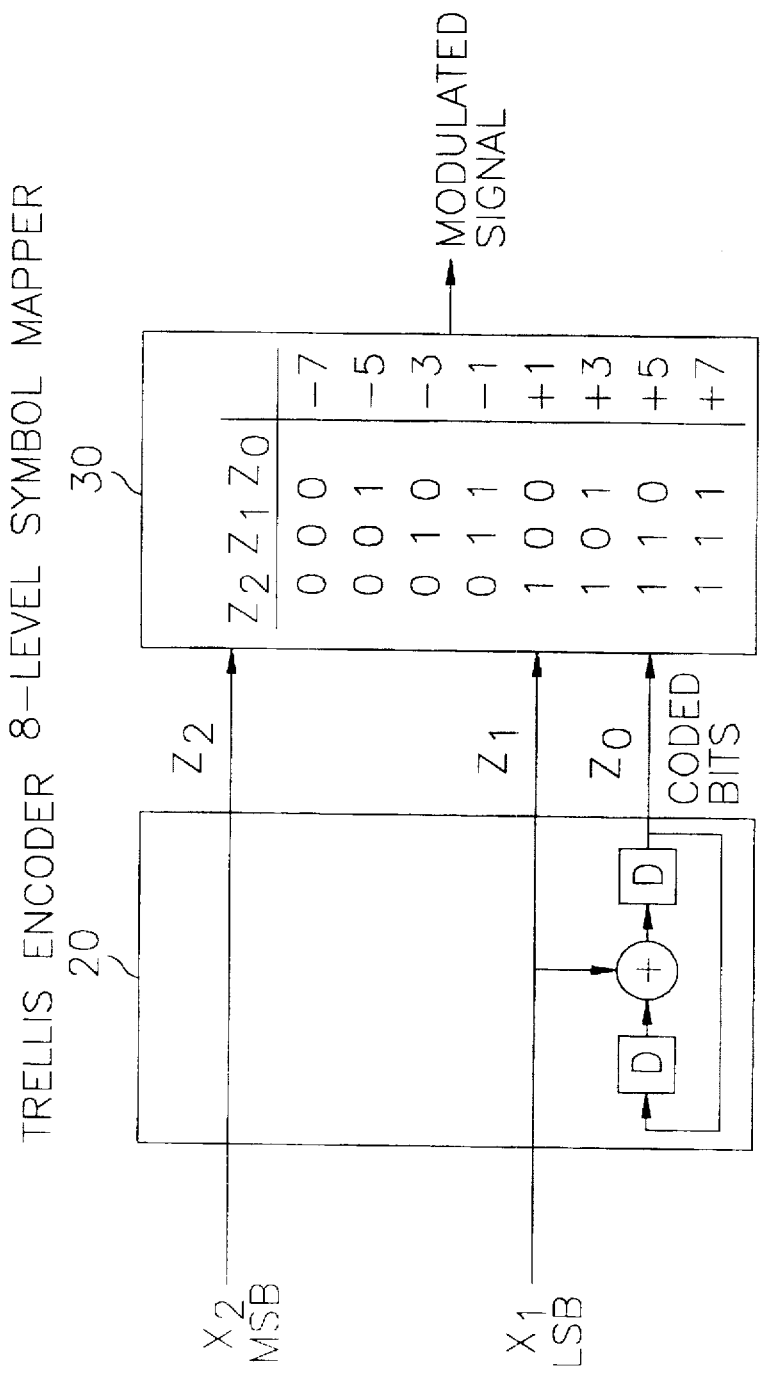
FIG. 1 shows a block diagram of a conventional trellis encoder.

A transmitted signal from a GA HDTV encoding system is received at the decoding system of the present invention. Each of the transmitted signals is processed in a demapper 110 to provide two bit metrics and a MSB, wherein the demapper 110 includes a hard decision block 130 and a bit metric deciding block 140. The MSB X2 is recovered at a hard decision block 130 from each of the received signals, with X2' denoting a reconstructed version of X2. In FIG. 1, a coded word with Z2 (or X2) value of 1 is mapped to a modulated signal whose amplitude is larger than 0 in a 1-dimensional signal space. Therefore, for a transmitted signal whose amplitude is larger than 0, X2' is determined as 1.

The metric deciding block 140 determines two bit metrics as will be explained with reference to FIGS. 4B and 4C below. The bit metrics are used to decode a ½ rate binary convolutional code, to thereby provide X1', a reconstructed version of the LSB X1. Specifically, the bit metrics are used in conjunction with a Viterbi decoder 120 which uses a soft-decision algorithm for decoding the convolutional code. By using a soft-decision maximum likelihood decoder, e.g., Viterbi decoder, the error occurred in the LSB X1 can be effectively corrected. Specifically, in a soft-decision Viterbi decoder, the coded bits Z0 and Z1 are not actually reconstructed from the transmitted signals. Instead, the Viterbi decoder 120 decodes an accumulated history of the bit metrics corresponding to Z0 and Z1 received from the metric deciding block 140 into X1', a reconstructed LSB X1.

The recovered MSB (X2') and LSB (X1') are coupled to a subsequent part of the GA HDTV decoding system for further processing. The first bit metric denoted as METRIC1 and the second bit metric denoted as METRIC2 signify a confidence level that Z0 and Z1 are 1, respectively.

Turning now to FIGS. 4A to 4C, there is depicted a bit metric decision scheme of the present invention. FIG. 4A depicts the function of the 8-level symbol mapper shown in FIG. 1. The numbers denoting the amplitudes of modulated signals are located above their corresponding modulated signal points on a segmented horizontal axis while the two bits in the parentheses denote the two coded bits Z1 and Z0 corresponding to each of the modulated signal points. The transmitted signal tends to be located between two modulated signal points but not exactly on a modulated signal point due to a transmission error.

For each of the coded bits Z0 and Z1, a bit metric is determined as shown in FIGS. 4B and 4C, respectively. A bit metric is determined as one of eight numbers 0 to 7 according to the position of the received signal on the horizontal axis. Therefore, the bit metrics become the indices ranging from 0 to 7 reflecting a confidence level that the coded bits are "1". FIG. 4B shows bit metric values for a first coded bit Z0 of a transmitted signal. The transmitted signal lies on the segmented horizontal axis wherein the numbers written in the larger size above the axis denote the amplitudes of corresponding modulated signals. The numbers 0 to 7 above the axis denote bit metrics. The numbers in the parentheses denote the values of Z0 for the corresponding modulation signal points.

Figure 2A:
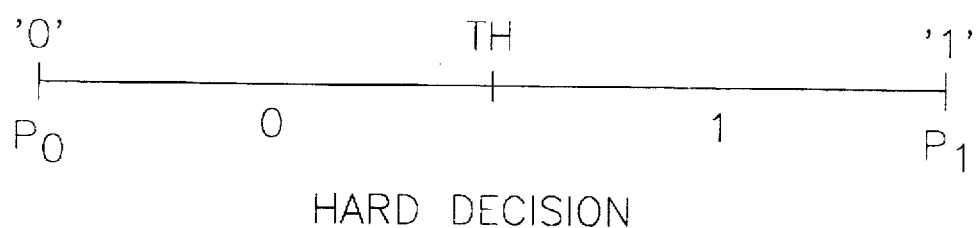
FIG. 2 illustrates a difference between the hard-decision and the soft-decision decoding methods.
Figure 2B:
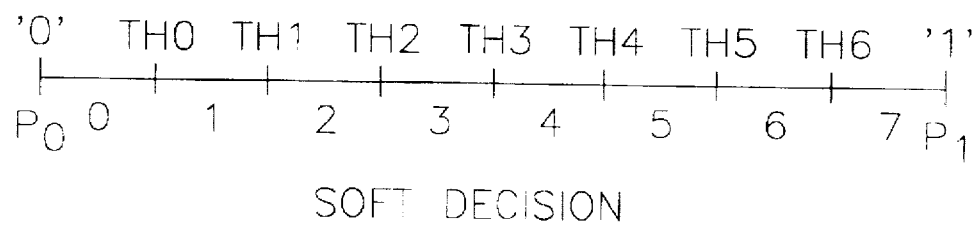

The bit metric decoding scheme of FIG. 4B is similar to that of FIG. 2 in that a segment between two neighboring modulated signal points is subdivided into 8 segments and each of the numbers 0 to 7 is assigned to each segment. A larger bit metric is assigned when the transmitted signal point is nearer to a modulated signal point whose Z0 bit is "1". In other words, when the coded bit Z0 for the transmitted signal is more likely to be "1", a larger bit metric is assigned.

FIG. 4C shows bit metrics for a second coded bit Z1 of the transmitted signal. The numbers in the parentheses denote the values of Z1 for the corresponding modulation signal points. The bit metric assigning rule of FIG. 4C is similar to that of FIG. 4B in that a larger bit metric is assigned if the transmitted signal position is nearer to a modulated signal point whose Z1 bit is "1". When Z1 values of two neighboring modulated signal points are different as in the case of amplitudes "3" and "5", a segment of the axis between the two adjacent modulated signal points is divided into 8 small segments and a number ranging from 0 to 7 is assigned to each of the small segments. However, for a transmitted signal lying between two modulated signal points whose Z1 values are identical to each other as in the case of amplitudes "1" and "3", either "0" or "7" is assigned as a bit metric depending upon the Z1 value as shown in FIG. 4C. That is, when Z1 values for two adjacent modulated signal points are "1", the bit metric for the segment between the two modulated signal points is "7"; and when Z1 values are "0", the bit metric for the segment between them is "0".

The bit metrics decided in this manner are fed to a Viterbi decoder 120 shown in FIG. 3 to recover the original sequence of LSB (X1).

The bit metric decision scheme presented in FIGS. 4A to 4C can be easily adapted to a system wherein the original signal at the HDTV encoder is represented by a 4-bit coded word.

While the present invention has been described with respect to the particular embodiments, it will be apparent to those skilled in the art that various changes and modifications may be made without departing from the spirit and scope of the invention as defined in the following claims.

What is claimed is:

1. A decoding system for recovering a data symbol including a first bit and (N−1) remaining bits from a transmitted signal, wherein the first bit of the data symbol is coded by a ½ convolutional encoder to provide a first and a second coded bits and a modulated signal corresponding to the data symbol is selected among $2^{N+1}$ predetermined signals on a 1-dimensional axis, an amplitude of each of the predetermined signals corresponds to one of $2^{N+1}$ combinations of the remaining (N−1)) bits of the data symbol and the first and the second coded bits, and the modulated signal is transmitted through a channel to form the transmitted signal, the decoding system comprising:

means for deciding the (N−1) remaining bits of the data symbol in response to the transmitted signal;

means for providing a first and a second bit metrics based on first and second coded bits corresponding to two neighboring predetermined signals, respectively, wherein an amplitude of the transmitted signal is smaller than that of one of the neighboring predetermined signal but greater than that of the other neighboring predetermined signal, and the first and the second bit metrics are represented by one of M number of integers, respectively, M being an integer greater than one, said integers representing the bit metrics have values ranging from 0 to M−1, wherein said providing means includes means for generating 0 as a bit metric if corresponding coded bits are both '0' and generating 7 as the bit metric if the corresponding coded bits are both '1', the corresponding coded bits representing the first or the second coded bits of the neighboring predetermined signals when the bit metric corresponds to the first or the second bit metric; and means for determining the first bit of the data symbol based on the first and the second bit metrics.

2. The decoding system of claim 1, wherein said providing means further includes means for generating an integer close to 0 or (M−1) as the bit metric if the corresponding coded bits are different from each other and the corresponding coded bit for the nearer of the two neighboring predetermined signals from the transmitted signal is "0" or "1".

3. The decoding system of claim 2, wherein M is 8.

* * * * *

UNITED STATES PATENT AND TRADEMARK OFFICE
CERTIFICATE OF CORRECTION

PATENT NO. : 5,757,863
DATED : May 26, 1998
INVENTOR(S) : Yong-Hee Lim

It is certified that error appears in the above-indentified patent and that said Letters Patent is hereby corrected as shown below:

On the title page, Item

[30] Foreign Application Priority Data

Nov. 28, 1994    [KR]    Rep. of Korea      94-31481

Signed and Sealed this

Eleventh Day of August 1998

*Attest:*

BRUCE LEHMAN

*Attesting Officer*      *Commissioner of Patents and Trademarks*